United States Patent [19]

Choi et al.

[11] Patent Number: 5,140,553
[45] Date of Patent: Aug. 18, 1992

[54] FLASH WRITING CIRCUIT FOR WRITING TEST DATA IN DYNAMIC RANDOM ACCESS MEMORY (DRAM) DEVICES

[75] Inventors: Hoon Choi, Taegu; Soo-In Cho, Seoul, both of Rep. of Korea

[73] Assignee: Samsung Electronics Co., Ltd., Kyounggi, Rep. of Korea

[21] Appl. No.: 470,834

[22] Filed: Jan. 26, 1990

[30] Foreign Application Priority Data

Jun. 10, 1989 [KR] Rep. of Korea ............... 89-8004

[51] Int. Cl.[5] .................. G11C 29/00; G11C 11/40
[52] U.S. Cl. .............................. 365/201; 365/203; 365/218; 365/238.5
[58] Field of Search ............... 365/218, 238.5, 189.04, 365/190, 201, 149, 203

[56] References Cited

U.S. PATENT DOCUMENTS

| | | | |
|---|---|---|---|
| 4,439,843 | 3/1984 | Takamatsu | 365/218 |
| 4,567,578 | 1/1986 | Cohen et al. | 365/218 |
| 4,587,629 | 5/1986 | Dill et al. | 365/218 |
| 4,873,672 | 10/1989 | Etoh et al. | 365/218 |
| 4,885,748 | 12/1989 | Hoffmann et al. | 365/201 |
| 4,916,700 | 4/1990 | Ito et al. | 365/201 |
| 4,956,819 | 9/1990 | Hoffmann | 365/201 |

FOREIGN PATENT DOCUMENTS

| | | | |
|---|---|---|---|
| 0120392 | 6/1986 | Japan | 365/149 |
| 0034796 | 2/1988 | Japan | 365/238.5 |
| 0308792 | 12/1988 | Japan | 365/149 |

*Primary Examiner*—Glenn Gossage
*Attorney, Agent, or Firm*—Ladas & Parry

[57] ABSTRACT

A flash writing circuit for testing of dynamic random access memory (DRAM) devices comprises a generally conventional DRAM device and includes additional elements for writing identical data in each memory cell via bit lines connected to the memory cells but without the use of the conventional I/O lines normally used to write data into the memory cells.

7 Claims, 1 Drawing Sheet

FLASH WRITING CIRCUIT FOR WRITING TEST DATA IN DYNAMIC RANDOM ACCESS MEMORY (DRAM) DEVICES

BACKGROUND OF THE INVENTION

This invention relates to a memory device such as a dynamic random access memory (DRAM) of high density, and more particularly to a flash writing circuit for testing such DRAMs.

As the DRAM becomes more and more highly integrated, precise processes for the fabrication of many layers and patterns of the devices are required, and the fault rate of the DRAM is determined by the amount of dust contaminants. Particularly, as the integration degree of the DRAMs increases, the fault rate is also increased so that, recently, DRAM-testing circuits are built within the memory device to perform an internal testing of the devices. Even if the testing of the DRAM is internally performed, the DRAM-testing time becomes longer in case of higher integration.

That is, in the conventional testing technique, the DRAM-test is carried out by a bit unit (x4, x8, x16) using test signals. The time required for testing increases according to the ratio of the integration density/xbit. Accordingly, the more integration density increases, the more test time increases since the writing and reading of the data are performed by a xbit unit through input/output lines and the read out data are analyzed to check for errors.

To reduce testing time, there has been developed a flash DRAM testing method which can write at one time the test data into each of the memory cells connected to a selected word line by writing and comparing directly the data on the bit lines, such writing being done without the use of the input/output (I/O) lines. In another flash writing method, the writing is made through the I/O lines. However, these methods can't write all the same data (1 or 0) into the memory cells connected to the selected word line according to the position of the bit lines and memory cells since the bit lines B/L and B/L are located in a constant sequence, that is, B/L, B/L, B/L, B/L, B/L, B/L, B/L, B/L, . .

SUMMARY OF THE INVENTION

It is an object of the present invention to provide a flash writing circuit for DRAM-testing which can rapidly write data onto bit lines without the use of I/O lines.

It is another object of the present invention to provide a flash writing circuit for DRAM-testing which can write all the same data on all the memory cells connected to a selected word line.

These objects are achieved by constructing a pair of flash bit line nodes to which all the bit lines are connected, and forming a data-writing path with the flash bit line nodes. That is, the same data is written, at the same time, on the bit-lines of each memory cell accessed by an internally selected word line.

In accordance with the present invention, a flash writing circuit for DRAM-testing of a memory circuit which includes a plurality of sense amplifiers, a plurality of memory cells, and a plurality of metal oxide semiconductor (MOS) transistors comprises: an equalizing and connecting means comprising a voltage equalizing MOS transistor and a pair of MOS transistors associated with each pair of bit lines connected to each of the sense amplifiers, a node connecting means connected to the equalizing and connecting means, and a flash write signal generating means for providing a difference voltage to the node connecting means when data is written in a memory cell.

DETAILED DESCRIPTION OF THE PREFERRED EMBODIMENTS

Figure 1:
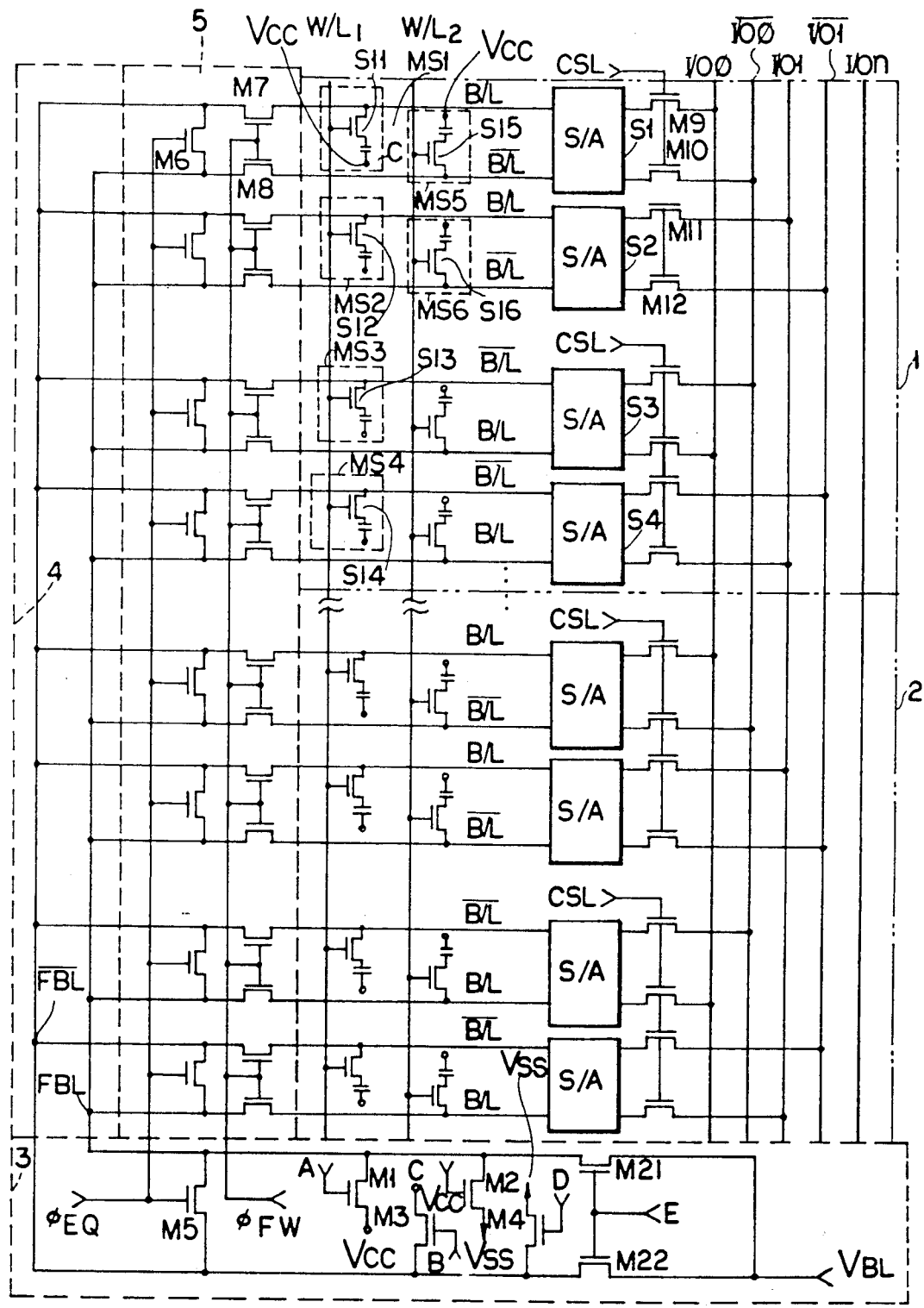
FIG. 1 is a circuit of an embodiment according to the present invention.

The present invention will be now described in more detail with reference to the accompanying drawing.

A first component part 1 and a second component part 2, which correspond to conventional DRAM structures, are provided as part of an integrated circuit (IC). That is, the first component part 1 includes a sense amplifier S1 connected between a pair of bit lines B/L and $\overline{B/L}$, MOS transistors M9 and M10 to connect input/output lines I/O$\phi$ and $\overline{I/O\phi}$ to the sense amplifier S1, and memory cells MS1 and MS5 respectively connected to word lines W/L1 and W/L2 to write and read data onto and from the pair of bit lines. Also the first component part 1 further includes a sense amplifier S2, MOS transistors M11 and M12, and memory cells MS2 and MS6. Similarly, the component part 1 includes sense amplifiers S3 and S4 and I/O lines and memory cells connected thereto.

The second component part 2 has the same structure as the first component part 1. The connection arrangements of the pair of bit lines B/L and $\overline{B/L}$ and the I/O lines with the sense amplifiers S1 and S2 are different from the connection arrangements of the bit lines and I/O lines with the sense amplifiers S3 and S4. The second component part 2 has the same connection arrangements as the first component part 1.

Also, an equalizing and connecting means 5 includes a MOS transistor M6 between the pair of bit lines B/L and $\overline{B/L}$ connected to the sense amplifier S1 for voltage equalization of the bit lines, and a pair of MOS transistors M7 and M8 for connecting the pair of bit lines B/L and $\overline{B/L}$ to a pair of nodes, FBL and $\overline{FBL}$ of a node connecting means 4. The other sense amplifiers have the same structure. The node connecting means 4 is constructed so that the bit lines of the memory cells MS1, MS2, . . . selected by a pair of word lines W/L1 and W/L2 are connected to the pair of nodes FBL and, $\overline{FBL}$.

A flash write signal generating means 3 is connected to the node connecting means 4. The flash write signal generating means 3 includes a MOS transistor M5 to voltage equalize the nodes FBL and $\overline{FBL}$, a datadeciding part, and a supply voltage providing part. When the data is rapidly written, the data-deciding part is driven by control logic signals A-D and includes MOS transistors M1 and M3 to provide a supply voltage level (VCC level) to the pair of nodes FBL and $\overline{FBL}$, and MOS transistors M2 and M4 to provide a ground voltage level (VSS level) to the pair of nodes FBL and $\overline{FBL}$.

According to the data (1 or 0) which is stored in the memory cells, the MOS transistors M1, M2 and M3, M4 are controlled by the control logic signals A-E in order to provide the supply voltage VBL to both the nodes FBL and $\overline{FBL}$. The part for providing the supply voltage VBL for the voltage equalization of the bit lines during a precharge cycle includes MOS transistors M21 and M22 which provide the supply voltage VBL to the pair of nodes FBL and $\overline{FBL}$. Also, the node connecting means 4 includes a pair of nodes FBL and $\overline{FBL}$ to provide the voltage generated in the flash write signal generating means to the bit lines.

Particularly, the node FBL is formed by commonly connecting one of bit lines (without the distinction either B/L or $\overline{B/L}$) of each of the bit line pairs, and the other bit line of each of the bit line pairs are also commonly connected to form the node $\overline{FBL}$. At this time, there is no distinction between the pair of nodes FBL and $\overline{FBL}$ or the pair of bit lines B/L and B/L. Therefore, the memory cells connected to the selected word lines all have the same data. In this regard, there is a basic difference between a writing method using the I/O lines and the present method.

The above structure of the present invention is now explained in greater detail.

The conventional DRAM has an alternately repeating structure of the first component part 1 and the second component part 2. Particularly, according to the connecting sequence of the I/O lines I/Oφ, $\overline{I/O\phi}$, I/O1, $\overline{I/O1}$ . . . , the bit lines B/L, $\overline{B/L}$ and B/L, $\overline{B/}$ of the component parts are alternately connected in the first component part 1 and in the second component part 2. Thus, when one word line W/L1 is accessed, each memory cell MS1, MS2, MS3, and MS4 is connected to a bit line B/L or $\overline{B/L}$.

In the conventional DRAM arrangement where the data is transferred to the bit lines through the I/O lines when the column selecting signal CSL is provided, the MOS transistors S11 and S12 of the memory cells MS1 and MS2 are connected to the I/O lines, while the MOS transistors S13 and S14 of the memory cells MS3 and MS4 are connected to the I/O lines so that the data stored in the memory cells which are selected by one word line are mixed '1's and '0's. This means that the same data can't be internally written but the data is externally regarded as the same.

This invention is to solve the above-mentioned problem and write the data in terms of the pair of nodes FBL and $\overline{FBL}$ by of the node connecting means 4 and connecting the accessed pair of bit lines B/L, $\overline{B/L}$ to the pair of nodes FBL and $\overline{FBL}$ in order to write the same data on the memory cells accessed by one selected word line.

First, the data writing and reading operation are identical with that of the conventional DRAM. At this time, the MOS transistors M1 to M4 of the flash with signal generating means 3 are biased off. That is, when the MOS transistors M9 and M10 are turned on by the column selecting signal CSL and the I/O lines are then selected, the I/O lines are connected sense amplifier S1 and the bit lines B/L and B/L. In the data writing operation, the capacitor C1 of the memory cell MSI selected by the word line W/L1 and the column selecting signal CSL, is charged by the sense amplifier S1 through the bit lines.

Next, in the data reading operation, the charge stored in the capacitor Cl is discharged to the bit line B/L through the MOS transistor S11 within the memory cell MS1. The sense amplifier S1 detects this signal state of the bit line and provides the amplified signal to the I/O lines. This operation is the same as the operation of conventional DRAMs. The other memory cells also operate similarly as described above.

The data flash writing operation for high speed testing of the DRAM according to the present invention is now described.

In the writing operation, since the data is directly transferred to the bit lines without the use of the I/O lines, the column selecting signal CSL is not applied to turn-on the MOS transistor M9 and M10. Also, the MOS transistors M21 and M22 are biased off by the signal applied to the node E, and the supply voltage VBL for the pair of nodes FBL and $\overline{FBL}$ is cut off.

In the reading operation, the word line W/L1 is selected by the row address, and the various control logic signals A-D are applied to the control signal generating part 3. In accordance with these control logic signals, the data which is provided to the pair of bit lines B/L and $\overline{B/L}$ of the accessed memory cell MS1 is determined. In the case that the current word line W/L1 is selected and the same data "1" is written on the internal memory cells MS1, MS2, . . . , the MOS transistors M1 and M4 are biased off and the MOS transistors M2 and M3 are turned on by the control logic signals A-D. Thus, the supply voltage VCC is transferred to the node $\overline{FBL}$ through the MOS transistor M3 and the VSS level is transferred to the node FBL through the MOS transistor M2. The sense amplifiers S1, S2, . . . , detect and amplify the difference voltage ΔV provided from the nodes FBL and $\overline{FBL}$, and also provide the amplified output to the pair of bit lines B/L and $\overline{B/L}$ so that the data "1" are identically stored in the memory cells MS1, MS2, . . .

Another embodiment of the present invention is now explained.

Both the transistors M2 and M3 are not turned on and only one transistor of the MOS transistors M2 and M3 is turned on when the identical data is written on the memory cells MS1, MS2, . . . . Even if only one transistor turns on, the difference voltage ΔV between the nodes FBL and $\overline{FBL}$ is generated and is transferred to the pair of bit lines B/L and $\overline{B/L}$. Similarly, the sense amplifiers S1, S2, . . . , detect the difference voltage and apply it to the pair of bit lines B/L and $\overline{B/L}$ as the VCC and VSS levels, respectively. Therefore, the same data "1" can be stored in the memory cells MS1, MS2, . . . . At this time, in both methods to generate the voltage difference between the nodes FBL and $\overline{FBL}$, an equalizing pulse φEQ applied to the gate of the MOS transistor M6 is at a low level, so the MOS transistor M6 is maintained off. But a pulse φFW is at a high level to turn the MOS transistors M7 and M8 on. Therefore, the nodes FBL and $\overline{FBL}$ are connected to the bit lines B/L and $\overline{B/L}$, respectively, so that the difference voltage ΔV required for a detection is transferred.

When the extended flash writing cycle is completed, the same data is written on all the memory cells MS1, MS2, . . . , connected to the word line W/L1. After the writing cycle, the equalizing pulse φEQ is provided at a high level during the precharge cycle so that the transistors M5 and M6 are turned on to voltage equalize the nodes FBL, $\overline{FBL}$ and the bit lines B/L, B/L. In this case, a high speed equalization can be totally performed by the nodes FBL and $\overline{FBL}$ connected to each bit line B/L and B/L. The MOS transistors M1 to M4 are biased off during the precharge and normal cycles, while the MOS transistors M21 and M22 are turned on during the precharge cycle to provide the supply voltage to the bit lines.

Up to now, the description relates to the same data "1" written on the memory cells, but the case of the data "0" is identical with that of the data "1" except that the MOS transistors M1 to M4 are turned on.

As mentioned above, this invention can not only write directly the data in each memory cell through the bit lines B/L and B/L the use of the I/O lines, but also rapidly write the data in each memory cell connected to a selected word line at the same time so that the time required for the DRAM testing can be largely reduced. Also, the present invention can write all the data in all the memory cells accessed by a selected word line, and also write internally the same data.

Moreover, the present invention uses the layout of the conventional DRAM as it is, and the flash write signal generating means is not positioned inside the memory array. Accordingly, the layout is simple and the voltage level equalization of the bit lines can be extremely fast.

The invention is in no way limited to the embodiment described hereinabove. Various modifications of disclosed embodiments as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A flash writing circuit for writing test data into a dynamic random access memory device, said device comprising a plurality of memory cells arrayed in rows and columns of memory cells, a plurality of word lines, each accessing a respective row of cells, a plurality of pairs of bit lines, each pair accessing a respective column of cells, a plurality of pairs of input/output lines, each pair of bit lines being connected to one of said pairs of input/output lines, a plurality of sense amplifiers each connected between a corresponding pair of bit lines and one of said pairs of input/output lines, with flash writing circuit comprising:

equalizing and connecting means for equalizing a potential level on all of said bit lines, said equalizing and connecting means comprising a plurality of first metal oxide semiconductor (MOS) transistors, each first MOS transistor respectively connected between the bit lines of a corresponding bit line pair, and a plurality of pairs of second MOS transistors, each second MOS transistor having a first source/drain electrode connected to a respective one of the bit lines, a node connecting means connecting to said equalizing and connecting means for providing a signal path from a flash write signal generating means to each of the bit lines, said flash write signal generating means being connected to said node connecting means for providing a difference voltage across the bit lines of each bit line pair, whereby the same data is written to all the memory cells accessed by a selected word line without the use of said input/output lines, said node connecting means comprising a pair of conductive paths extending between said flash write signal generating means and each bit line pair, each of said conductive paths connected to a second source/drain electrode of a plurality of said second MOS transistors, said flash write signal generating means comprising a third MOS transistor for equalizing voltage levels on said conductive paths, a plurality of fourth MOS transistors for supplying said test data by providing predetermined voltage levels to each of said conductive paths in response to control logic signals, and fifth and sixth MOS transistors each having a source/drain path connected between a respective one of said conductive paths and a precharge potential source for applying a precharge potential level to said conductive paths.

2. A flash writing circuit according to claim 1 wherein a conductive state of each second MOS transistor is controlled by a flash write signal from said flash write signal generating means.

3. A flash writing circuit according to claim 1, further including a plurality of pairs of seventh MOS transistors for connecting each sense amplifier to respective ones of the associated pairs of input/output lines in response to a corresponding column selecting signal applied to the gates of a corresponding pair of seventh transistors, and wherein, during operation of the memory device in modes of writing and reading out of data using said input/output lines, selected ones of said pairs of seventh transistors are biased on while, during operation of the memory device when writing test data, all of said pairs of seventh transistors are biased off.

4. A circuit according to claim 1 wherein said plurality of fourth MOS transistors are biased off during operation of the memory device in data writing and reading modes of operation using said input/output lines.

5. A circuit according to claim 1 wherein said fifth and sixth MOS transistors are biased on for providing said precharge potential level to said conductive paths and are biased off while writing said test data.

6. A flash writing circuit according to claim 1 wherein said plurality of fourth MOS transistors include a first pair of transistors for selectively applying a supply voltage (Vcc) level to one of said conductive paths and a second pair of transistors for applying a selectively ground voltage (Vss) level to one of said conductive paths.

7. A circuit according to claim 6 wherein said plurality of fourth MOS transistors are biased off during operation of the memory device in data writing and reading modes of operation using said input/output lines.

* * * * *